US007030621B2

(12) United States Patent
Sarkozi et al.

(10) Patent No.: US 7,030,621 B2
(45) Date of Patent: Apr. 18, 2006

(54) LOW CURRENT AC PARTIAL DISCHARGE DIAGNOSTIC SYSTEM FOR WIRING DIAGNOSTICS

(75) Inventors: Janos Gyorgy Sarkozi, Niskayuna, NY (US); Nicole Andrea Evers, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/838,474

(22) Filed: May 4, 2004

(65) Prior Publication Data

US 2006/0038573 A1 Feb. 23, 2006

(51) Int. Cl.
*G01R 31/08* (2006.01)

(52) U.S. Cl. ...................... 324/536; 324/534; 324/541; 324/544

(58) Field of Classification Search ................ 324/536, 324/540, 541, 544, 534
See application file for complete search history.

(56) References Cited

U.S. PATENT DOCUMENTS 6,161,077 A * 12/2000 Fawcett ...................... 702/58
6,617,859 B1 * 9/2003 Orton ........................ 324/544
6,686,746 B1 * 2/2004 Allan et al. ................ 324/533
6,876,203 B1 * 4/2005 Blades ...................... 324/536
2002/0097056 A1 7/2002 Blades
2002/0130668 A1 9/2002 Blades

OTHER PUBLICATIONS

U.S. Appl. No. 10/063,603, filed May 3, 2002. "Monitoring System and Method for Wiring Systems", p 1-24, Drawings Figures 1-14 (9 Sheets).

* cited by examiner

*Primary Examiner*—Walter Benson
(74) *Attorney, Agent, or Firm*—Flether Yoder

(57) ABSTRACT

A system and method for detecting partial discharges or arcing in wiring or cables is disclosed. The system employs a high-voltage AC power source to generate a high-voltage low-current AC waveform, which is propagated through a selected wire, which in turn, produces the return signal. The return signal is processed using a signal processor and the analyzed for indications of the occurrence of a partial discharge. The method detects damage to a selected wire by utilizing high voltage, low current AC waveforms to induce partial discharges in a controlled manner and detecting a return signal resulting from the discharge.

20 Claims, 6 Drawing Sheets

LOW CURRENT AC PARTIAL DISCHARGE DIAGNOSTIC SYSTEM FOR WIRING DIAGNOSTICS

GOVERNMENT INTERESTS

This disclosure was made with Government support under Contract No. N00014-02-C-0402 a-warded by the Office of Naval research. The Government has certain rights in this disclosure.

BACKGROUND OF THE DISCLOSURE

This disclosure relates generally to systems and methods for detecting defects in wiring, and more particularly, to systems and methods for detecting partial discharges or arcing in wiring or cables.

Wiring is a critical system in aircraft, shipboard, industry and home applications. Aircraft wiring integrity and safety related issues are known to be serious and have received a great deal of interest after the Swissair 111 and TWA 800 accidents. Also, electrical fires in industry account for a large portion of property loss, and electrical fires in the home is a significant portion of the fires occurring in the home that threaten life and damage property.

Aircraft wiring insulation is much thinner than that found in building wiring in order to reduce weight. This thin insulation deteriorates with age due to changes in chemical composition, vibration during flights, large temperature changes, and exposure to agents such as dust, salt, moisture and cleaning chemicals. This wiring is also exposed to other mechanical stresses during maintenance. The aforementioned effects will degrade the insulation, causing cracks and chafing. These insulation defects can cause arcing between wires or surrounding metals. Humidity together with salt and dust depositions can make the arc creation more probable.

The detection of aircraft wiring defects is primarily performed by visual inspection by maintenance personnel. This manual inspection is a slow process and its reliability is not satisfactory. Furthermore, as it requires twisting the wiring in order to check chafing, this visual inspection often causes more problems than it can identify.

There is existing test equipment on the market for cable testing based on electrical measurements using Time Domain Reflectometry or Frequency Domain Reflectometry. Both Time Domain and Frequency Domain Reflectometry analyse signals produced by reflections from pulses, of predefined characteristics, transmitted through a wire under test. The sensitivity of these methods is usually not satisfactory to detect all insulation damage.

Time Domain Reflectometry is a testing and measurement technique that has found increasing usefulness in testing transmission lines (both metallic and fiber-optic), cables, strip lines, connectors, and other wideband systems or components. Time Domain Reflectometry is a technique in which reflections from a transmitted signal, e.g., an electrical pulse, are monitored to locate faults and to determine the characteristics of power transmission lines. The transmitted signal, preferably a very fast step pulse, is fed into the system and the reflections resulting from discontinuities or impedance deviations in the system are analyzed. When the input pulse meets with a discontinuity or impedance mismatch, the resultant reflections, appearing at the feed point, are compared in phase, time, and amplitude with the original pulse. By analyzing the magnitude, deviation, and shape of the reflected waveform, the nature of the impedance variation in the transmission system can be determined.

General Dynamics of Redmond, Wash. recently introduced a new test apparatus called the Micro-Energy Dielectric (MED) tool, as disclosed in U.S. Patent Application Publication No. U.S. 2002/0130668. This device uses a high DC voltage to generate discharges or arcs at insulation defects in a cable bundle under test. If a fault exists between the wire under test in the cable and any other grounded wires in the cable that has a breakdown voltage less than the maximum test voltage applied, the full discharge of the available charge stored in the cable, e.g., not a partial discharge, will occur at the fault, potentially further damaging the wire or cable. The location of the discharge is then determined in several ways by measuring the electromagnetic (e.g., RF region) and acoustic signals the discharge generates. First, the MED tool measures high frequency voltage pulse edges generated by the discharge at one end of the cable and determines the location of the discharge; second, a Electromagnetic Locating Tool (EML) measures the radiated (e.g., outside the cable) electromagnetic signal (radio waves) with receivers having suitable antennae and calculates the location of the discharge based on the arrival times of the signals at the receivers; and lastly, an Ultrasonic Locating Tool (ULT) measures the acoustic noise (e.g., sound waves) and the electromagnetic edge the discharge generates and determines the distance to the arc by timing the difference in arrival times of the two signals.

Therefore, a need exists for techniques to detect defects in wiring and cables that can be perform by means other than visual inspection and will not cause further degradation to the wire or cable under test.

BREIF DESCRIPTION OF THE DISCLOSURE

The present disclosure uses partial discharges to detect insulation defects in wiring. Partial discharges have much lower energy than full discharges; therefore, the degradation of the wire under test caused by the partial discharges during test is negligible.

Partial discharge (PD) testing is a sensitive, widely used method to characterize the condition of insulation materials. In the various embodiments, a low current AC voltage is used to generate partial discharges in the selected wire under test. The voltage of an AC power supply is filtered by a current limiting series resistor and the internal capacitance of the wire to produce a smooth AC waveform in the wire under test suitable for partial discharge diagnostics. A high voltage relay based multiplexer system is employed to select the wire under test from a plurality of wires. The PD signal is detected with a high frequency current transformer or capacitive sensor. The location of the defect is then also calculated using the characteristics of the measured signal.

An aspect of the present disclosure provides for a diagnostic system for detecting and diagnosing low current AC partial discharges in a plurality of wires, each wire including a conductor surrounded by an insulator. The diagnostic system includes a high voltage AC power source for generating a high voltage, low current AC waveform, at least one multiplexer or switch in electrical communication with the high voltage AC power source and the plurality of wires and configured for allowing selective addressing of an individual wire of the plurality of wires, a signal processor for processing signals produced by the high voltage, low current AC waveform as it is transmitted through the individual wire, and a controller configured for actuating the multiplexer or switch to selectively address the individual wire and for controlling the high voltage AC power source.

An additional aspect of the present disclosure provides for a method for detecting and diagnosing low current AC partial discharges in a plurality of wires. The diagnostic method is performed by generating a high voltage, low current AC waveform, selective addressing individual wires of the plurality of wires, and transmitting the AC waveform along the selected individual wires. The method further provides for processing the signals produced by the high voltage, low current AC waveform as it is transmitted through the individual wire and controlling the selective addressing of the individual wire and the AC waveform generation.

The PD signals can be detected as a voltage signal, e.g., by capacitively coupling the wire under test to a voltage waveform digitizer, or the PD signal can be detected with a high frequency broadband current transformer.

According to another aspect of the present disclosure, a diagnostic system for detecting wiring defects selectively using partial discharge detection and time domain reflectometry is provided. The diagnostic system includes a high voltage AC power source for generating low-current, high-voltage and low-voltage AC waveforms. At least one partial discharge detection subsystem for detecting partial discharges in a wire, and at least one time domain reflectometry subsystem for detecting signals produced by a reflection of the AC waveform (e.g., pulse) by a wiring defect are also included. The system provides a selector switch for selectively operating one of the two diagnostic subsystems. The subsystem selection may be performed manually by toggling a switch or automatically through a controller unit and relays or other such electrically controllable switches. A second selector switch allows selective addressing of an individual wire of the plurality of wires or wiring bundle. The AC waveform or pulse is thus transmitted through the selected subsystem and onward through the selected wire under test. The waveform or pulse travels through the wire until a defect is encountered, at which point a return signal is produced. A signal processor processes the return signals produced by the AC waveform and determines the type and extent of the wiring defect. A controller circuit is configured to operate the first and second selector switches to selectively address the subsystems and the individual wires and control the AC power source.

According to a further aspect of the present disclosure, a diagnostic method for detecting wiring defects selectively using partial discharge detection and time domain reflectometry. The diagnostic method comprising the steps of generating low-current, high-voltage and low-voltage AC waveforms; providing at least one partial discharge detection means for detecting partial discharges, said partial discharges being produced by said low current, high voltage AC waveform; providing at least one time domain reflectometry detection means for detecting signals produced by a reflection of said low voltage AC waveform by a wiring defect; selecting between said partial discharge detection means and said time-domain reflectometry detection means; selective addressing of an individual wire of said wiring; and processing signals produced by said AC waveform as said waveform is transmitted through the individual wire of said wiring and reflected by said wiring defects.

When the method is applied to a wiring bundle, an individual wire of the wiring bundle is first selected prior to transmitting the AC waveform along the selected individual wire. Signals produced by the AC waveform as the waveform is transmitted through the individual wire and encounters defects are processed. The subsystem selection, selective addressing of the individual wire and the AC waveform generation are preferably automatically controlled.

BRIEF DESCRIPTION OF THE DRAWINGS

The above and other aspects, features, and advantages of the present disclosure will become more apparent in light of the following detailed description when taken in conjunction with the accompanying drawings in which.

DETAILED DESCRIPTION OF THE DISCLOSURE

Figure 1:
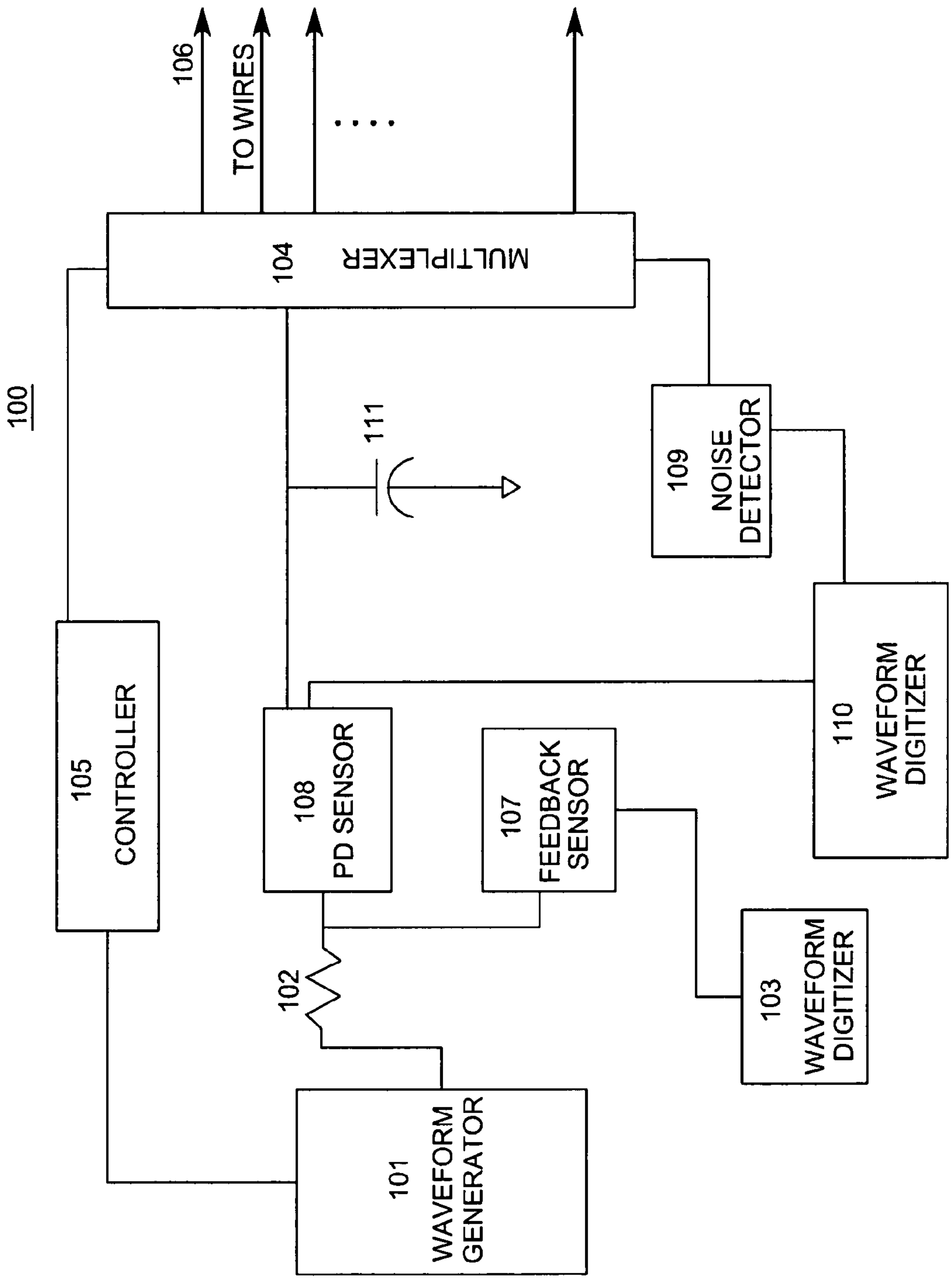
FIG. 1 illustrates an embodiment of a system for monitoring defects in a wire.

Preferred embodiments of the present disclosure will be described hereinbelow with reference to the accompanying drawings. In the following description, well-known functions or constructions are not described in detail to avoid obscuring the disclosure in unnecessary detail.

The insulation condition of a wire, cable or cable bundle can be tested by partial discharge (PD) diagnostics. Electric discharges that do not completely bridge two electrodes or conductors in close proximity to each other are called Partial Discharges (PD). The magnitude of such discharges are usually very small, the amount of charge transferred is in the range of ten to a few hundred picoCoulombs (pC). Four types of partial discharges are distinguishable:

1. Internal discharges in gas filled cavities of a dielectric material
2. Surface discharges
3. Corona discharges
4. Discharges in electric trees The type of partial discharge detected is dependant on the exact nature of the insulation defect present. The different types of discharges can cause different types of signal waveforms. Based on the signal waveform, the defect type can be identified. The system of the present disclosure is able to detect all the discharge types described above.

For generating a partial discharge, a suitable electric field is applied to the dielectric material(s), which is realized by connecting the suitable potential difference between the electrodes comprising the dielectric(s). For practical PD testing of cables, the potential difference may be applied to the wire under test, e.g., a conductor surrounded by an insulator, and the wires or other conductors surrounding or near to it. For a cable bundle containing more than one wire, the potential difference may be applied between the wire (or wires) under test and the neighboring wires. In the case of a cable bundle or wire with conductive shielding, the potential difference may be applied between the wire or wires under test and the conductive shielding. To test the insulation in between the wire and its outer environment for an unshielded cable bundle or wire, the potential difference may be applied between the wire or wires and a conductive body, for example, of an aircraft or the conductive cable holder electrically connected to the aircraft body. Hereinafter, the term cable bundle will be used to refer to a single insulated wire or multiple wires in a cable bundle (independently of their internal arrangement). Both cases can either be shielded with a conductive material or unshielded.

For PD diagnostics, the potential difference applied can be DC or AC. If the potential difference is DC, the occurrence of the partial discharges will have a random nature in time and the number of partial discharges during a given time period and their intensity will be determined by the potential difference applied, the polarity of the potential difference and the cable bundle and it's environment under test. For a potential difference alternating in time (AC), the partial discharge activity will have phase correlation to the AC potential inducing it. As the partial discharge testing with AC potential difference contains more information on the nature of the insulation defect, it is preferable to use AC for inducing a partial discharge.

Referring to FIG. 1, a system 100 for detecting partial discharges in a plurality of wires is shown. The system 100 includes a high voltage AC power supply/waveform generator 101 for producing an AC waveform having predetermined characteristics, e.g., amplitude, frequency, etc. The AC waveform is propagated through a high-value (e.g., high resistance) current-limiting resistor 102. The current-limiting resistor 102 provides protection against damage to wiring, electronics and appliances that may be connected to the wiring being tested, by high AC current. Current-limiting resistor 102 is in the GΩ range in one embodiment of the disclosure. It is also important to reduce the maximum current to prevent causing permanent damage in the cable insulation by accidentally applying too high of a voltage which may result in arcing between conductors. As an example, consider the case of a 2000V potential difference and a 1 GΩ resistance. The maximum continuous current into the arc is therefore a maximum of 2 μA, after discharging the cable capacitance. This low energy dissipated into the arc will not cause damage to the insulation of the cable which will negatively influence the cable's performance. Additionally, the current-limiting resistor 102 along with the internal capacitance on the cable being tested further smoothes the AC waveform, producing an AC waveform that is suitable for PD diagnostics.

From the current-limiting resistor 102, the AC waveform propagates on through a feedback sensor 107, which may be part of a voltage divider, connected to a waveform digitizer 103 as well as continuing on to a multiplexer 104. The waveform digitizer 103 provides monitoring of frequency, amplitude, etc. of the AC waveform and feedback control to the high voltage AC power supply/waveform generator 101.

The multiplexer 104, controlled by a control unit 105, selectively connects the AC voltage to one wire 106 of the plurality of wires, and grounds the other wires in the cable harness or bundle. The multiplexer 104 may be a series of mechanical switches or, preferably, the multiplexer may be based on reed relays. A return signal, coming from the selected test wire 106, is detected by a partial discharge sensor 108, e.g., a capacitively coupled sensor, high frequency broadband current transformer, etc. and relayed to a second, high-speed waveform digitizer 110. Alternatively, the waveform digitizers 103 and 110 may be a single unit. The second waveform digitizer 110 analyses the return signal and determines the condition of the selected test wire 106 by comparing the return signal against a set of stored and characterized signal parameters to determine which type of partial discharge has occurred. The second waveform digitizer 110 will have a detection range of 1 Giga-samples per second, since the signal is propagating through the cable at about 90% of c (i.e. speed of light). Additionally, an optional capacitor 111 may be included between the partial discharge sensor 108 and the multiplexer 104 to increase the RC time constant of the system.

Long cable bundles can also collect high frequency noise from the environment. The differentiation of the noise from the PD signal is not always possible based on the waveform of the signals. Therefore, a second wire may be selected simultaneously by the multiplexer 104 to act as a reference for detecting noise that may be present in a wire bundle. The noise signal is detected by a noise detector 109, e.g., a second capacitively coupled sensor, current transformer, etc., and relayed to the second waveform digitizer 110, wherein the noise signal is used to remove noise present in the return signal from the selected test wire 106. If noise is measured with the noise detector 109 on a wire from the same cable bundle or from a cable bundle in the same noise environment as the wire(s) under test, the noise will be the same or very similar to the noise measured on the wire(s) under test. The measured noise signal can be used to subtract the noise from the measured noisy PD signal or can be used for gating the PD signal measurement in case the noise is above a predefined limit.

Special data processing algorithms, residing in the waveform digitizers 103, 110, have been developed (e.g., fuzzy logic, wavelet analysis, etc.) for PD signal analysis to separate the noise signal from the PD signal and to categorize the PD signals giving more information on the defect type.

The high voltage AC power supply 101 may be tunable, such that the frequency and amplitude of the output signal may be varied. In this case, the test system 100 may be configured to step through increasing frequency and amplitude values until either a partial discharge is detected by the partial discharge sensor 108 or a maximum setting is reached. The maximum setting is determined by the specification of the selected test wire 106 as provided by the wire manufacturer, thus the severity of any defect can be determined.

Figure 6:
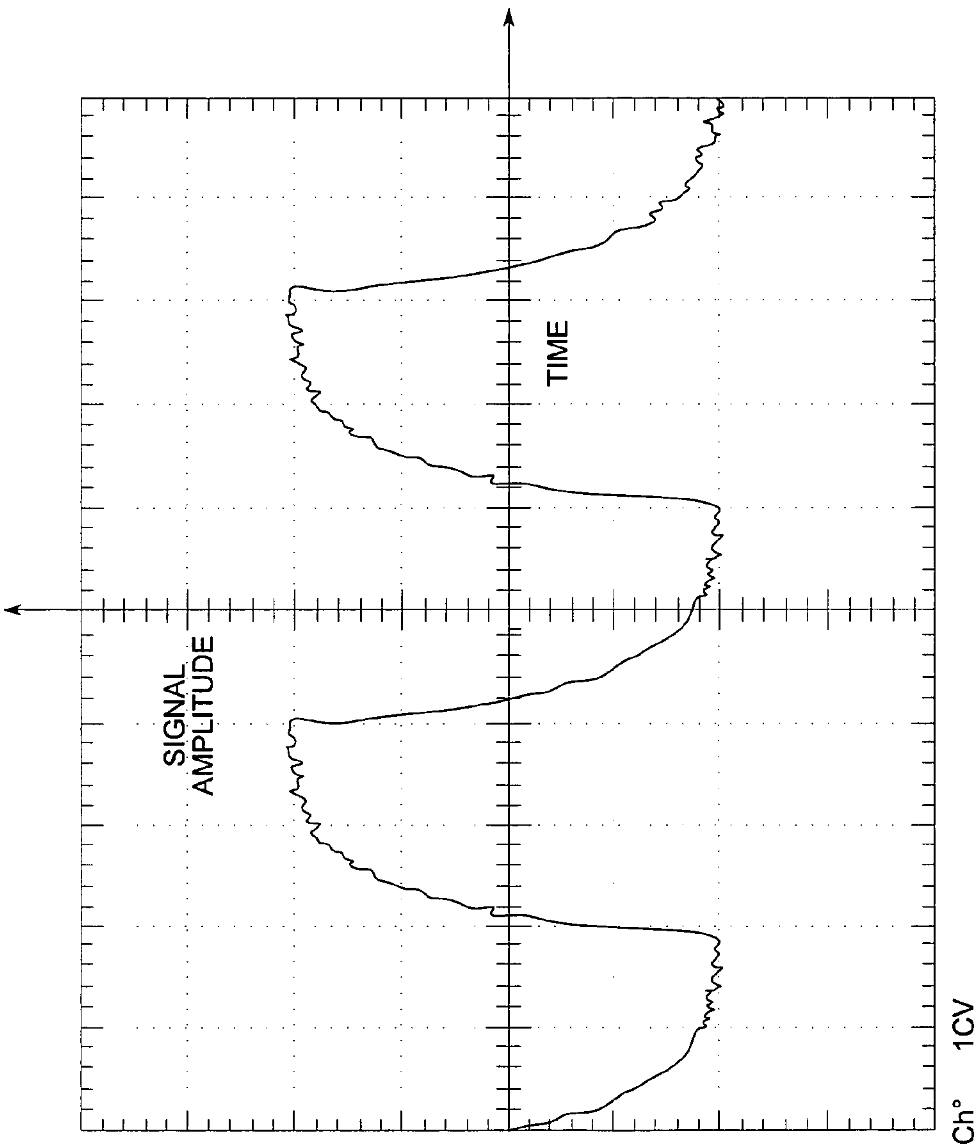
FIG. 6 illustrates a desired AC waveform for use in partial discharge detection.

For the present disclosure, the AC voltage does not have to be sinusoidal. The preferred waveform in the positive half period should gradually increase then sharply decrease and in the negative half period should gradually decrease then sharply increase, as shown in FIG. 6. Other, more complex waveforms may also be used. The frequency of the AC voltage is from about 0.1 Hz to about 1 KHz, but other frequencies outside this range also may be employed. The frequency of the AC voltage can change during test.

It is also possible to use an AC voltage with a superposed DC bias voltage. The creation and interpretation of the PD signature is dependent on the actual voltage waveform used to generate the PD activity.

Depending on the cable bundle and its condition, the voltage required to induce partial discharges, i.e., the inception voltage, can be as high as several KV. The inception voltage of the partial discharge is influenced by the insulation type, nature of the defect, and the environmental conditions e.g. gas pressure and the gas composition.

The leakage resistance and the capacitance between the wire under test and the other wires in the cable bundle can be calculated from the waveform of the AC voltage on the wire under test. The test must be performed at a voltage level where there is no or negligible PD activity. From the measured leakage resistance, capacitance of the wire under test, the capacitance value of the optional capacitor 111 and from the value of the current limiting resistor 102, the optimal AC Voltage switching frequency can be determined.

Figure 2:
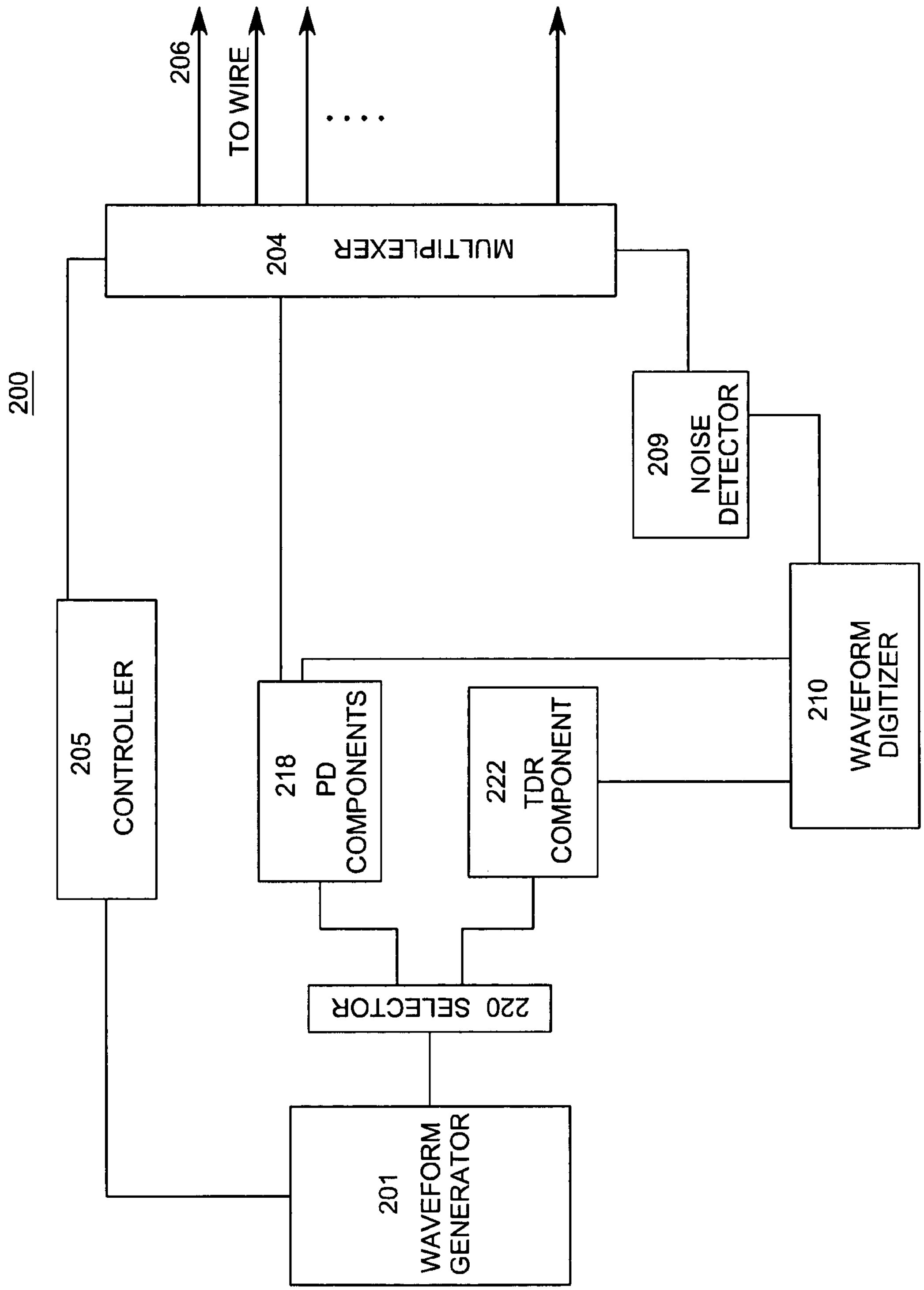
FIG. 2 illustrates a block diagram of a system for diagnosing wiring defects using a partial discharge detection subsystem and time domain reflectometry subsystem.

Referring to FIG. 2, an alternate embodiment of a system 200 for detecting defects in a plurality of wires is shown. The system 200 includes a high voltage AC power supply/waveform generator 201 for producing an AC waveform or pulse having predetermined characteristics, e.g., amplitude, frequency, duration, etc. The AC waveform is propagated through a selector switch 220 which may be any of a variety of electrically or mechanically controlled high voltage relays and switches. The selector switch 220 allows selective use of either partial discharge detection components 218, or time domain reflectometry (TDR) components 222, via manually positioning a toggle, etc., or electronically by a controller unit 205. The controller unit 205 additionally controls the characteristics of the AC waveform or pulse. The AC waveform propagates, from either the partial discharge detection components 218 or the time domain reflectometry components 222, on through a second switch, e.g., multiplexer 204, also controlled by the controller unit 205. The multiplexer 204 provides selective routing of the AC waveform or pulse to a specific wire under test 206 in a wire bundle.

A return signal, coming from the selected test wire 206, is detected by the previously selected detection components 218 and 222 and relayed to a waveform digitizer 210. The waveform digitizer 210 analyses the return signal and determines the condition of the selected test wire 206.

A single waveform digitizer 210 may be used for both PD and TDR analysis, however, each analysis method has unique requirements, which must be met by the waveform digitizer 210 used. For PD analysis, the waveform digitizer 210 will have a detection range of one Giga-samples-per-second and be capable of handling low frequency, in the range of about 0.1 Hz to about 1 KHz, high voltage AC. While for TDR analysis, the waveform digitizer 210 detection rate can be stepped down, but will also be sensitive enough to handle the lower voltages (1V–10V) associated in TDR analysis.

The detection components 218 and 222 may share common subcomponents. However, some characteristics are significantly-different between the two detection components 218 and 222. The partial discharge detection component 218 includes a current-limiting resistor 102 and a partial discharge detector 108, as described above in relation to FIG. 1. On the other hand, the TDR detection component 222 includes a TDR sensor, as known in the art. Additionally, the two detection components 218 and 222 may be one unit capable of performing both partial discharge and time-domain reflectometry detection.

For the TDR test, a low voltage, e.g., 1V, pulse is launched into the wire under test. For the PD test, a high AC voltage is connected to the wire under test. The selection of the pulse or high voltage AC voltage source can be performed by the controller 205, which will subsequently position the selector 202 appropriately. It is possible to produce the pulse for the TDR test and the high AC voltage for the PD test with fast, high voltage switch-based hardware with two different controls for the two test types. For the PD test, the fast high voltage switches can be used to generate the high AC voltage from controllable high voltage DC power supplies. In this case, the capacitance of the cable is charged via a high resistance resistor to produce smooth AC waveform on the wire(s) under test. For the TDR test, the high resistance resistor is bypassed with, e.g., a high voltage reed relay, and one of the fast high voltage switches can produce the pulse required for the TDR measurement.

Furthermore, system 200 includes a noise detector 209 which performs substantially the same as described above in relation to system 100.

Figure 3:
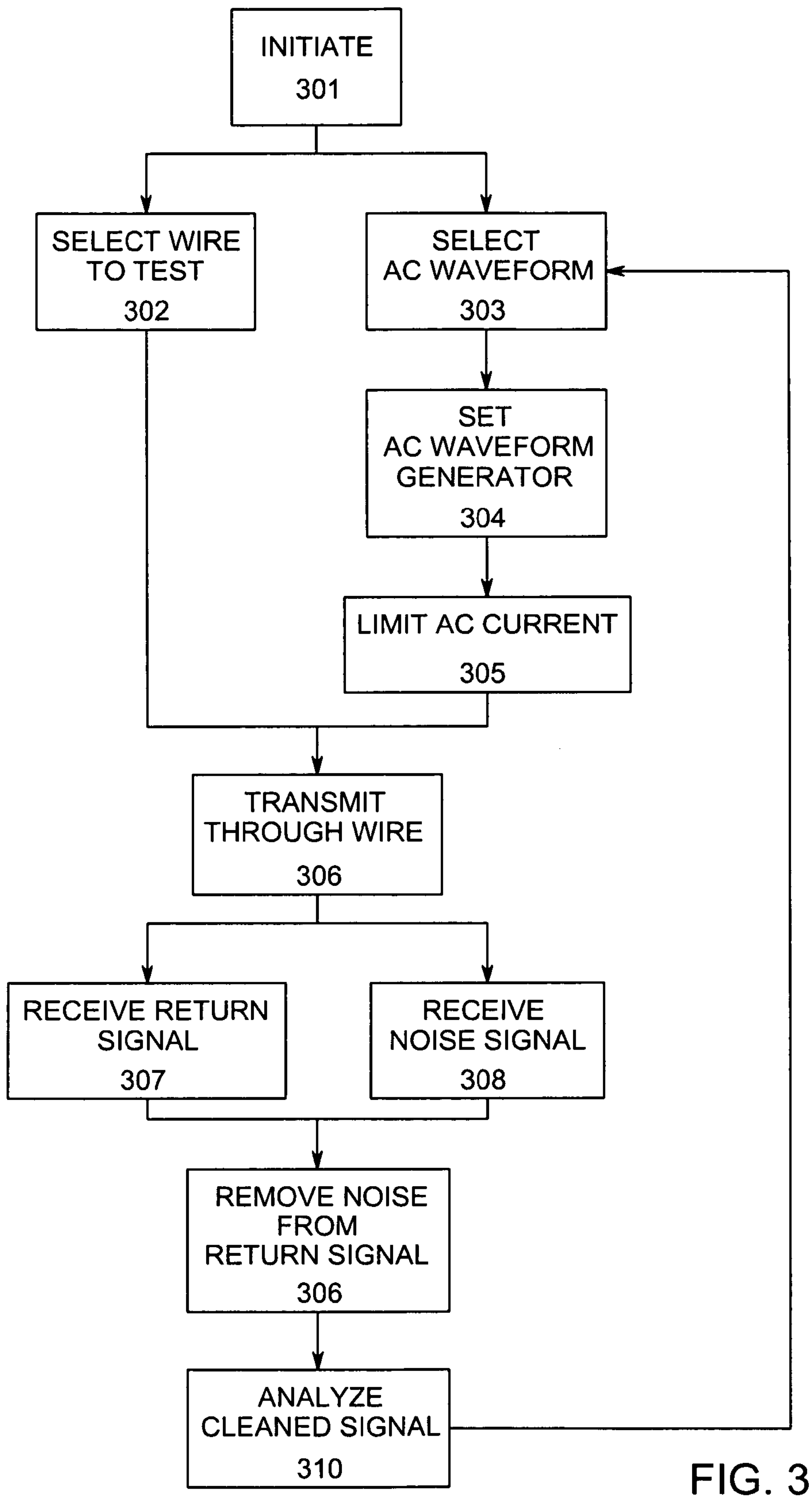
FIG. 3 is a flowchart of the steps performed by the partial discharge detection subsystem.

With reference to FIG. 3, a method for detecting partial discharges in wiring is disclosed. In step 301, the detection method is initialized, followed by the test wire selection in step 302 and the selection of the waveform characteristics in step 303. In step 304, the high voltage AC power supply/waveform generator 101 is tuned to the values determined in step 303 and an AC waveform is generated. In step 305, the AC waveform generated in step 304 is propagated through a current-limiting resistor 102 to provide protection to systems and equipment from damage by high current. In step 306, the AC waveform propagates through the test wire selected in step 302. A return signal is produced by the test wire, which is received by a partial discharge sensor 108 in step 307. Optionally, in step 308, a noise signal is received from other, adjacent wires. Both the return signal and the noise signal are sent to a waveform digitizer 110, where the noise signal is used to cancel out noise present in the return signal in step 309. The resulting clean signal is analyzed to determine the type of partial discharge and severity of the insulation deterioration. In cases where the AC power supply 101 is frequency and amplitude adjustable, the process may continue with new AC waveform characteristic values selected in step 303 and proceeding therefrom as described previously.

Beyond detecting the presence of an insulation degradation, it is possible to determine the location of the partial discharge pulses along the cable bundle from the partial discharge signal. This technique is based on the finite propagation time of the PD signal along the cable (and the reflection of the same PD signal at the cable ends). When a partial discharge occurs in the cable under test, two different signals propagate along the cable toward the two ends of the cable. When the two signals reach the cable terminations, they are completely reflected. By measuring the arrival times of the two different signals at one end of the cable or at both ends of the cable, it is possible to determine the position of the source generating the PD signal.

Figure 5:
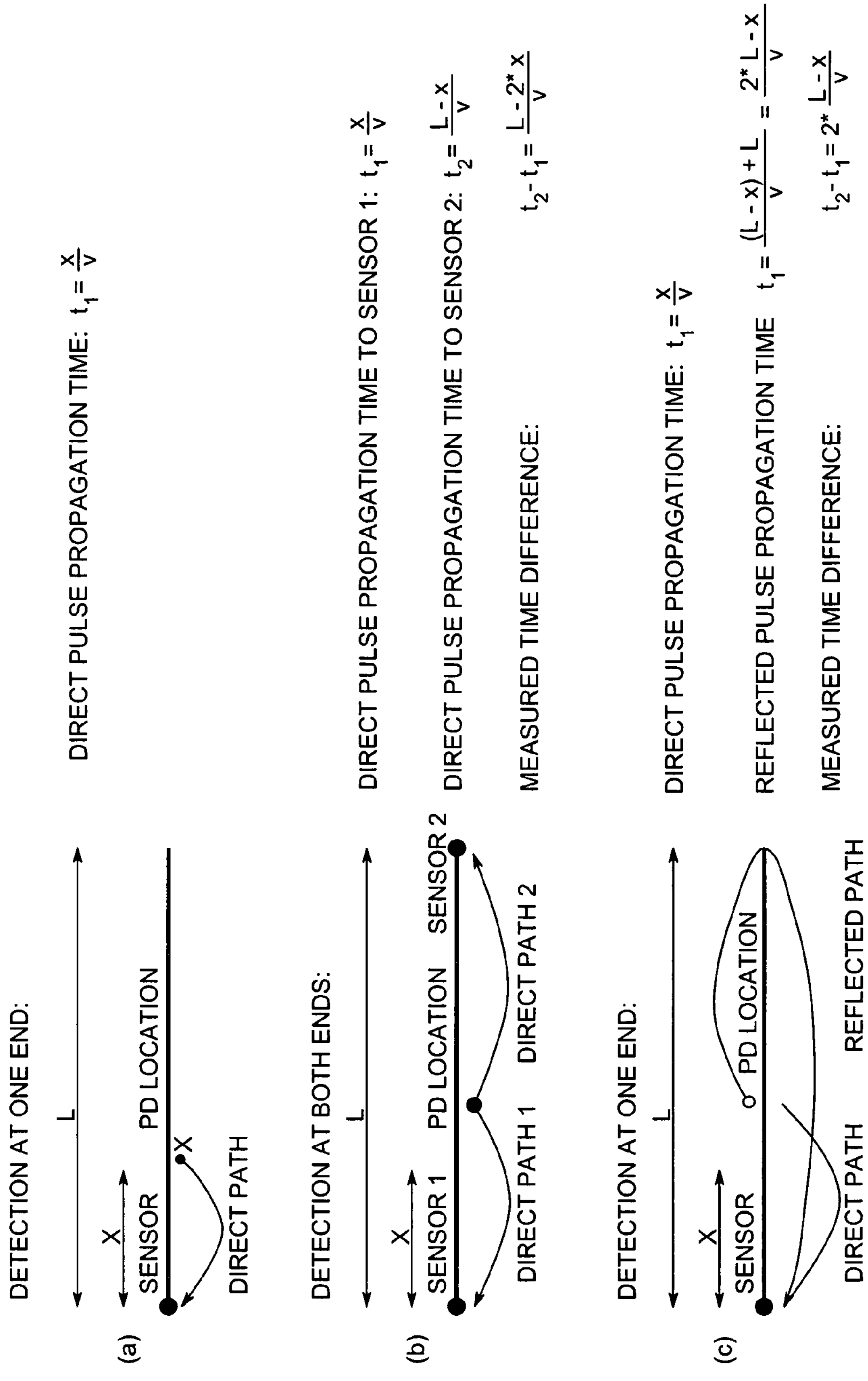
FIG. 5 illustrates several methods for determining a location of a partial discharge.

The position of the partial discharge pulses may be calculated as shown in FIG. 5 where x is the distance to the defect, L is the length of wire and tn is the arrival time of the pulse at the end of the cable bundle. This technique is used by the PD system of FIG. 1 and the PD component 218 of FIG. 2 and based on the finite propagation time of the PD signal along the cable (and the reflection of the same PD signal at the cable ends).

For PD signal analysis, it is necessary to collect the partial discharge signal for at least one cycle of the inducing high AC voltage or for several milliseconds for DC high voltage case. To be able to use advanced data analysis tools, like fuzzy logic or wavelet analysis, it is necessary to record the whole waveform of the PD pulses. The recording of the PD pulse waveform is also required for determining the position of the source generating the PD signal. Thus, to determine the source of the PD signal with suitable accuracy, the sampling rate of the data acquisition is in the range at or above 1 Gs/s.

In Time Domain Reflectometry, a short pulse is launched into a cable under test at one end. The pulse travels to the other end of the cable where it is reflected back and detected at the sourcing end of the cable. Reflections are also produced along a cable if there is a change in the cable impedance. Large changes, i.e., resulting from shorts or opens, in the cable impedance cause large reflections, while small changes, i.e., resulting from junctions, minor insulation chaffing, cracks, cause small reflections.

Figure 4:
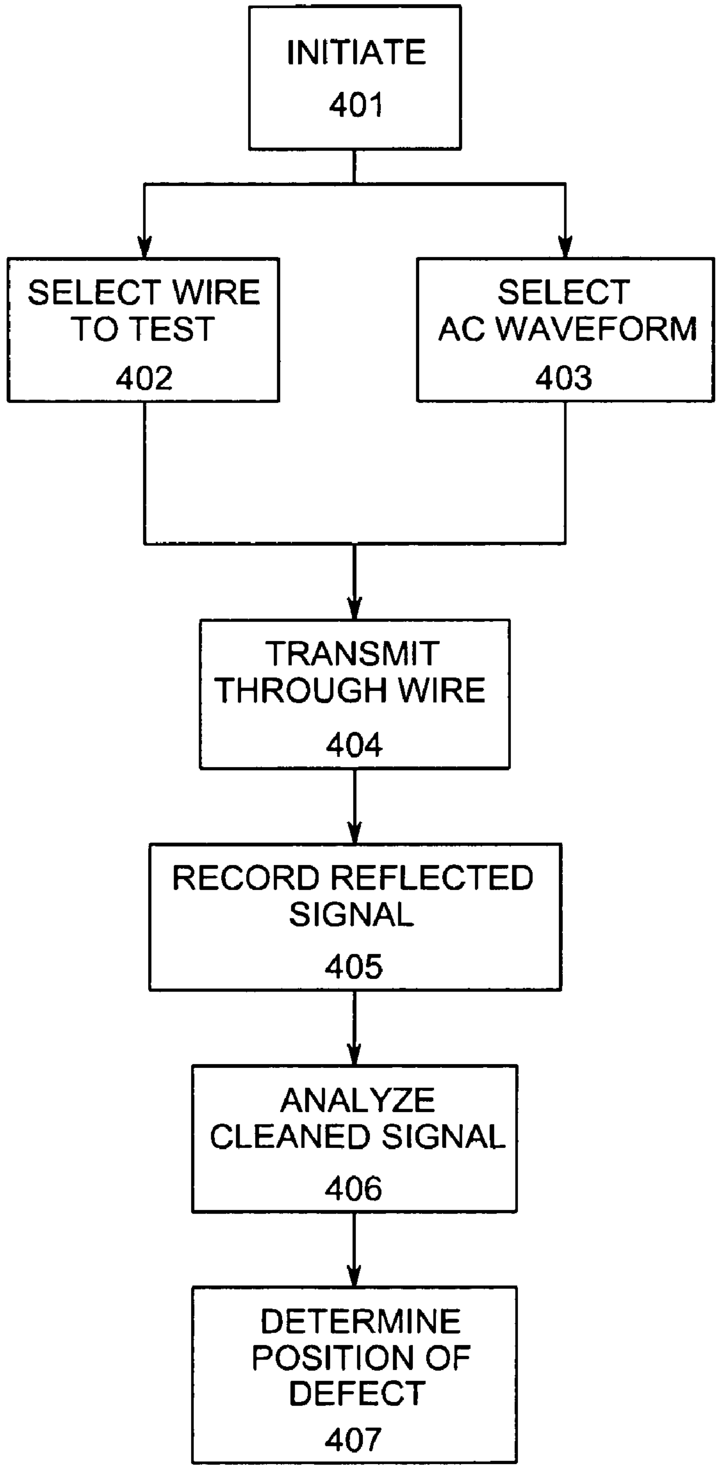
FIG. 4 is a flowchart of the steps performed by the time domain reflectometry subsystem.

With reference to FIG. 4, a method for wire defect diagnostics using time domain reflectometry is provided. The process begins with the selection and activation of the TDR components in step 401. In step 402, a wire is selected for testing. The AC waveform/pulse generator 201 is configured to produce a low voltage test pulse in step 403. Proceeding on to step 404, the pulse is transmitted into the wire. Preferably, the pulse is rectangular, but pulses with other waveforms can also be used. The pulse width should be as small as possible and is determined by the test equipment, distance of the reflection and attenuation of the wire under testing. The pulse width may be selectable from a few ns to a few μs manually or automatically by the controller unit 205.

In step 405, the reflected pulse waveform is recorded with the data recording started at the time the test pulse is transmitted. In step 406, the recorded waveform is analyzed by comparing the recorded waveform against stored characterized waveform properties, thus determining the condition of the wire. Additionally, in an optional step 407, the position, along the length of the wire under test, is determined, as shown in FIG. 5. The accuracy of detecting the location of the reflection is primarily determined by the sampling rate of the data acquisition system, similar to the PD signal source location measurement, thus a high sampling rate is preferable.

While the disclosure has been illustrated and described in typical embodiments, it is not intended to be limited to the details-shown, since-various modifications and substitutions can be made without departing in any way from the spirit of the present disclosure. As such, further modifications and equivalents of the disclosure herein disclosed may occur to persons skilled in the art using no more than routine experimentation, and all such modifications and equivalents are believed to be within the spirit and scope of the disclosure as defined by the following claims.

What is claimed is:

1. A diagnostic system for detecting low current AC partial discharges in a plurality of wires, each wire having a conductor surrounded by an insulator, said diagnostic system comprising:

a high voltage AC power source for generating a high voltage, low current AC waveform, wherein said AC waveform is characterized by a smooth and gradual increase and immediately followed by a sharp decrease in amplitude across a positive half period and a smooth and gradual decrease and immediately followed by a sharp increase in a negative half period;

at least one switch in electrical communication with said high voltage AC power source and said plurality of wires and configured to allow selective addressing of an individual wire of said plurality of wires;

a signal processor for processing signals produced by said high voltage, low current AC waveform as said waveform is transmitted through the individual wire of said plurality of wires; and a controller configured for actuating said at least one switch to selectively address said individual wire and for controlling said high voltage AC power source.

2. The diagnostic system as in claim 1, wherein said AC waveform has a frequency in the range of about 0.1 Hz to about 1 KHz.

3. The diagnostic system as in claim 1, wherein said signal processor compares said processed signals against a set of stored and characterized signal parameters to determine a type of partial discharge that occurred.

4. The diagnostic system as in claim 3, wherein said partial discharge types are selected from the group consisting of: internal discharges in gas filled cavities of a dielectric material, surface discharges, corona discharges, and discharges in electric trees.

5. The diagnostic system as in claim 1, further comprising a noise detector configured for detecting noise occurring from environmental conditions, wherein said signal processor separates said noise from said signal produced by the AC waveform.

6. The diagnostic system as in claim 1, wherein said at least one switch is any combination of devices selected from a group consisting of: a multiplexer or relay.

7. A diagnostic method for diagnosing partial discharges in plurality of wires, each wire having a conductor surrounded by an insulator, said diagnostic method comprising the steps of:

selective addressing of an individual wire of said plurality of wires;

generating a high voltage, low current AC waveform, wherein said AC waveform is characterized by a smooth and gradual increase and immediately followed by a sharp decrease in amplitude across a positive half period and immediately followed by a smooth and gradual decrease and a sharp increase in a negative half period;

transmitting said AC waveform along said selected individual wire;

processing signals produced by said high voltage, low current AC waveform as said waveform is transmitted through the individual wire of said plurality of wires; and determining if a partial discharge has occurred in said selected individual wire from said processed signals.

8. The diagnostic method as in claim 7, wherein said AC waveform has a frequency in the range of about 0.1 Hz to about 1 KHz.

9. The diagnostic method as in claim 7, further comprising the step of comparing said processed signals against a set of stored and characterized signal parameters to determine a type of partial discharge that occurred.

10. The diagnostic method as in claim 9, wherein said partial discharge types are selected from the group consisting of: internal discharges in gas filled cavities of a dielectric material, surface discharges, corona discharges, and discharges in electric trees.

11. The diagnostic method as in claim 7, further comprising the steps of:

detecting noise occurring from environmental conditions; and separating said noise from said signal produced by the AC waveform.

12. A diagnostic system for detecting wiring defects, said diagnostic system comprising:

a high voltage AC power source for generating low-current, high-voltage and low-voltage AC waveforms;

at least one partial discharge detection subsystem for detecting partial discharges, said partial discharges being produced by said low-current, high-voltage AC waveform;

at least one time domain reflectometry subsystem for detecting signals produced by a reflection of said low voltage AC waveform by a wiring defect;

a first at least one switch in electrical communication with said AC power source and said partial discharge detection subsystem and said time domain reflectometry subsystem, said first at least one switch is configured to allow selection of at least one of said subsystems;

a second at least one switch in electrical communication with said subsystems and a plurality of wires and configured to allow selective addressing of an individual wire of said plurality of wires;

a signal processor for processing signals produced by said AC waveform as said waveform is transmitted through the individual wire of said plurality of wires and reflected by said wiring defect; and a controller configured for actuating said first and second at least one switches to selectively address said subsystems and said individual wire and for controlling said AC power source.

13. The diagnostic system as in claim 12, wherein said AC waveform is characterized by a smooth and gradual increase and a sharp decrease in amplitude across a positive half period and a smooth and gradual decrease and a sharp increase in a negative half period.

14. The diagnostic system as in claim 12, wherein said low-voltage AC waveform is a square wave pulse having a duration in the range of nanoseconds to microseconds.

15. The diagnostic system as in claim 12, wherein said AC waveform has a frequency in the range of about 0.1 Hz to about 1 KHz.

16. The diagnostic system as in claim 12, wherein said signal processor compares said processed signals against a set of stored and characterized signal parameters to determine a type of partial discharge that occurred.

17. The diagnostic system as in claim 16, wherein said partial discharge types are selected from the group consisting of: internal discharges in gas filled cavities of a dielectric material, surface discharges, corona discharges, and discharges in electric trees.

18. The diagnostic system as in claim 12, further comprising a noise detector configured for detecting noise occurring from environmental conditions, wherein said signal processor separates said noise from said signal produced by the AC waveform.

19. The diagnostic system as in claim 12, wherein said first and second at least one switches are any combination of devices selected from a group consisting of: a multiplexer or relay.

20. A diagnostic method for detecting wiring defects, said diagnostic method comprising the steps of:

generating low-current, high-voltage and low-voltage AC waveforms;

providing at least one partial discharge detection means for detecting partial discharges, said partial discharges being produced by said low current, high voltage AC waveform;

providing at least one time domain reflectometry detection means for detecting signals produced by a reflection of said low voltage AC waveform by a wiring defect;

selecting between said partial discharge detection means and said time-domain reflectometry detection means;

selective addressing of an individual wire of said wiring; and processing signals produced by said AC waveform as said waveform is transmitted through the individual wire of said wiring and reflected by said wiring defects.

* * * * *